US005097274A

United States Patent [19]

Drake et al.

[11] Patent Number: 5,097,274

[45] Date of Patent: Mar. 17, 1992

[54] OVERLAPPING CHIP REPLACEABLE SUBUNITS, METHODS OF MAKING SAME, AND METHODS OF MAKING RIS OR ROS ARRAY BARS INCORPORATING THESE SUBUNITS

[75] Inventors: Donald J. Drake, Rochester; Herman A. Hermanson, Penfield, both of N.Y.

[73] Assignee: Xerox Corporation, Stamford, Conn.

[21] Appl. No.: 732,540

[22] Filed: Jul. 19, 1991

Related U.S. Application Data

[62] Division of Ser. No. 539,340, Jun. 18, 1990.

[51] Int. Cl.[5] .................... G01D 15/18; H01L 29/06

[52] U.S. Cl. .................... 346/140 R; 357/55; 357/75; 439/44; 361/400

[58] Field of Search .................... 357/80, 81, 75, 55; 439/44, 65, 66, 71, 74; 361/400, 403, 388; 437/205, 209, 51, 226; 346/140 R

[56] References Cited

U.S. PATENT DOCUMENTS

| | | | |
|---|---|---|---|
| 4,601,777 | 7/1986 | Hawkins et al. | 156/626 |
| 4,612,554 | 9/1986 | Poleshuk | 346/140 R |
| 4,690,391 | 9/1987 | Stoffel et al. | 269/21 |
| 4,712,018 | 12/1987 | Stoffel et al. | 250/578 |
| 4,774,530 | 9/1988 | Hawkins | 346/140 R |
| 4,830,985 | 5/1989 | Araghi et al. | 437/209 |
| 4,851,371 | 7/1989 | Fisher et al. | 437/226 |
| 4,961,821 | 10/1990 | Drake et al. | 156/647 |

*Primary Examiner*—Benjamin R. Fuller
*Assistant Examiner*—Alrick Bobb
*Attorney, Agent, or Firm*—Oliff & Berridge

[57] ABSTRACT

Overlapping chip replaceable subunits for RIS or ROS array bars are disclosed. The subunits include a planar semiconductive substrate having at least one component and supporting circuitry on a surface thereof. The semiconductive substrate has first and second side edges, a front edge and a width equal to a distance between the first and second side edges. The planar semiconductive substrate is mounted on a planar support which can be, for example, a daughterboard/heat sink assembly having at least one electrode having a terminal at one end thereof. The planar support also has first and second side edges, a front edge and a width equal to a distance between the first and second side edges. The width of the support is less than the width of the semiconductive substrate so that the first and second side edges of the planar semiconductive substrate extend outwardly beyond the first and second side edges, respectively, of the support. The structure of the present invention enables extended arrays of subunits to be accurately placed on one surface of a substrate, while permitting individual subunits to be removed from the substrate easily and without damaging adjacent subunits or their electrical connections to the host machine.

11 Claims, 5 Drawing Sheets

OVERLAPPING CHIP REPLACEABLE SUBUNITS, METHODS OF MAKING SAME, AND METHODS OF MAKING RIS OR ROS ARRAY BARS INCORPORATING THESE SUBUNITS

This is a division of application Ser. No. 07/539,340 filed June 18, 1990.

BACKGROUND OF THE INVENTION

1. Field of the Invention

The present invention involves replaceable subunits for Raster Input Scanning (RIS) or Raster Output Scanning (ROS) array bars, methods of fabricating these subunits and methods of fabricating extended arrays (RIS or ROS array bars) from these subunits, and particularly to subunits which include semiconductive substrates (or chips) having RIS or ROS components thereon and which are mounted on a support such as a daughterboard/heat sink assembly, each semiconductive substrate having a width greater than the width of each corresponding support so that the sides of the semiconductive substrate overlap the sides of the support.

2. Description of Related Art

Fabrication of pagewidth silicon devices, such as RIS arrays and ROS arrays from extended arrays of discrete subunits impose economically difficult fabricating processes on manufacturers because of the close tolerance requirement for the abutting edges of side-by-side subunits assembled to produce these pagewidth devices. RIS array subunits include, for example, Charge Coupled Devices (CCD's) which typically include a semiconductive substrate, made from silicon or gallium arsenide, having an array of photosites and supporting circuitry on one surface thereof. ROS array subunits include, for example, thermal ink jet printheads which typically include a semiconductive substrate (heater plate) made from silicon having a set of heating elements and passivated addressing electrodes formed thereon and an ink flow directing channel plate having parallel ink channels in communication with a manifold on one end and open at another end, aligned with and bonded to the heater plate, so that each ink channel contains a heating element. Two general architectures emerge in the design of large RIS or ROS bars using the subunit approach one in which all the subunits are located on one side of a substrate bar (which can function as a heat sink), and one in which subunits are staggered on either side of the bar. FIG. 1A shows a RIS or ROS bar 2 using the staggered approach wherein a plurality of subunits 6 are staggered on both sides of a substrate bar 4. FIG. 1B shows a RIS or ROS bar 8 wherein a plurality of subunits 6 are arranged on the same side of bar 4.

Using thermal ink jet printheads as an example, the advantage of the same side approach is that electrical and ink connections are simplified and thickness variations in the substrate bar do not introduce stitching problems (improper mating of adjacent characters produced by printhead subunits arranged on opposite sides of a bar having a variable thickness). A disadvantage of the same side approach is that it is difficult to remove defective or worn out subunits without disturbing or damaging adjacent subunits or the electrical connections of adjacent subunits to the daughterboard (which is formed on or attached to the heat sink substrate bar). The primary advantage of the staggered approach is that there is room between subunits so that individual subunits can be removed without damaging adjacent subunits.

U.S. Pat. Nos. 4,601,777 to Hawkins et al and 4,774,530 to Hawkins disclose carriage-type thermal ink jet printheads. These printheads include a channel plate having a plurality of nozzle-forming channels on a lower surface thereof which is bonded to the upper surface of a heater plate which includes a plurality of resistive heating elements so that a single resistive heating element is located in each channel of the channel plate. Each resistive heating element on the channel plate includes an addressing electrode having a terminal at one end thereof. The bonded channel plate and heater plate define a fully-operational thermal ink jet printhead. The printhead is attached to a daughterboard by bonding the lower surface of the heater plate to the daughterboard. The daughterboard also includes a plurality of electrodes each of which has a terminal at one end thereof to facilitate plugging into a female receptacle. The heater plate terminals are wire-bonded to the daughterboard electrodes so that each resistive element on the heater plate can be actuated by electronic pulses supplied to the daughterboard terminals. For an example of a printhead bonded to a daughterboard, see FIGS. 2 and 3 of the 4,601,777 patent.

U.S. Pat. No. 4,612,554 to Poleshuk discloses an ink jet printhead composed of two identical parts, each having a set of parallel V-grooves anisotropically etched therein. The lands between the grooves each contain a heating element and its associated addressing electrode. The grooved parts permit face-to-face mating, so that they are automatically self-aligned by the intermeshing of the lands containing the heating element and electrodes of one part with the grooves of the other part. A pagewidth printhead is produced by offsetting the first two mated parts, so that subsequently added parts abut each other and yet continue to be self-aligned. As shown in FIGS. 11 and 13 of this patent, each identical part which includes a plurality of resistive elements and associated addressing electrodes having terminals, is bonded to a flexible T-shaped board which includes a plurality of intermediate electrodes that are wire-bonded to the addressing electrode terminals. The T-shaped board is then mounted on an appropriate daughterboard, the intermediate electrodes being electrically connected to electrodes on the daughterboard.

U.S. Pat. Nos. 4,690,391 and 4,712,018 to Stoffel et al disclose a method and apparatus for fabricating full width scanning arrays. Smaller scanning arrays are assembled in abutting end-to-end relationship, each of the smaller arrays being provided with a pair of V-shaped locating grooves in the face thereof. An aligning tool having predisposed pin-like projections insertable into the locating grooves on the smaller scanning arrays upon assembly of the smaller arrays with the aligning tool is used to mate a series of smaller arrays in end-to-end abutting relationship.

U.S. Pat. No. 4,830,985 to Araghi et al discloses methods of fabricating image sensor arrays whereby smaller arrays containing, for example, photosites on one surface thereof are fabricated to have interlocking shapes which are used to accurately locate and align a plurality of smaller arrays on a substrate to form a long scanning array. The smaller arrays can be removed from the substrate by heating, lifting and sliding the smaller arrays relative to the substrate.

OBJECTS AND SUMMARY OF THE INVENTION

It is an object of the present invention to provide subunits for full width RIS or ROS arrays and methods of fabricating these subunits, which are easily replaceable without damaging remaining subunits in the array.

It is another object of the present invention to provide a method of fabricating full width RIS or ROS bars from arrays of smaller subunits, whereby each subunit is accurately positioned and aligned in the array while being easily replaceable.

It is another object of the present invention to provide full width RIS or ROS bars composed of a plurality of subunits whereby electrical and/or ink connections are simplified.

It is a further object of the present invention to provide a full width RIS or ROS bar fabricated from an extended array of smaller subunits whereby stitching problems are eliminated.

To achieve the foregoing and other objects, and to overcome the shortcomings discussed above, overlapping chip replaceable subunits for RIS or ROS array bars are disclosed. These subunits include a planar semiconductive substrate (or chip) having at least one component and supporting circuitry on a surface thereof. The semiconductive substrate has first and second side edges, a front edge and a width equal to a distance between the first and second side edges. The subunit also includes a planar support which can be, for example, a daughterboard/heat sink having at least one electrode having a terminal at one end thereof upon which the planar semiconductive substrate is mounted. The planar support also has first and second side edges, a front edge and a width equal to a distance between the first and second side edges. The width of the support is less than the width of the semiconductive substrate so that the first and second side edges of the planar semiconductive substrate extend outwardly beyond the first and second side edges, respectively, of the support. Preferably, the front edge of the semiconductive substrate also extends outwardly beyond the front edge of the support. The structure of the present invention enables extended arrays of subunits to be accurately positioned on one surface of a large array substrate bar, while permitting individual subunits to be removed from the bar easily and without damaging adjacent subunits or their electrical connections to the host machine.

Methods of fabricating the above-described subunits include butting one or more alignment tabs formed on a lower surface of the semiconductive substrate with the front and/or side edges of the support so that the front and/or side edges of the semiconductive substrate extend outwardly beyond the front and/or side edges of the support. Alternatively, an aligning jig can be used to precisely align each semiconductive substrate with a support wherein the semiconductive substrate and the support are each precisely placed on separate alignment substrates which are then moved together in a controlled manner (e.g., by being hingedly attached to each other) to precisely attach and align each semiconductive substrate with a corresponding support. High resolution, large array semiconductive devices such as pagewidth RIS or ROS bars can be fabricated from the above-described subunits by aligning and bonding subunits to form integral linear arrays. Side edges of the semiconductive substrates from adjacent subunits can be butted against one another while the front edges of the semiconductive substrates are butted against an aligning tool to properly align each subunit in the extended array. Alternatively, an alignment feature, such as alignment rails, can be formed on a surface of an alignment substrate and the subunits can be aligned on the alignment substrate by butting front and/or side edges of the support with the alignment rails.

BRIEF DESCRIPTION OF THE DRAWINGS

The invention will be described in detail with reference to the following drawings in which like reference numerals refer to the like elements and wherein.

DETAILED DESCRIPTION OF THE PREFERRED EMBODIMENTS

Figure 1A:
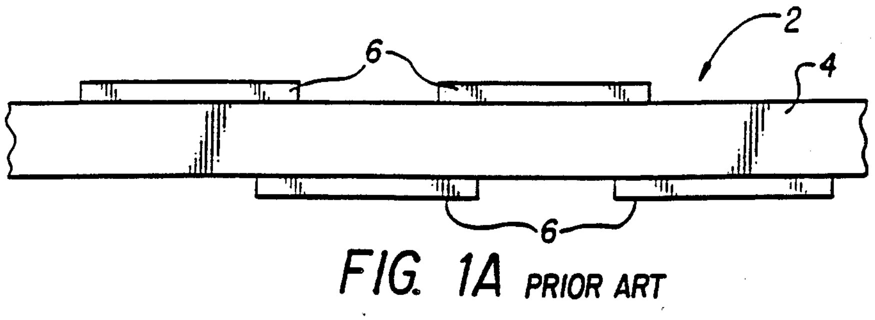
FIG. 1A PRIOR ART
FIG. 1A is a front view of a RIS or ROS array bar whereby individual subunits are arranged using a staggered approach.
Figure 1B:
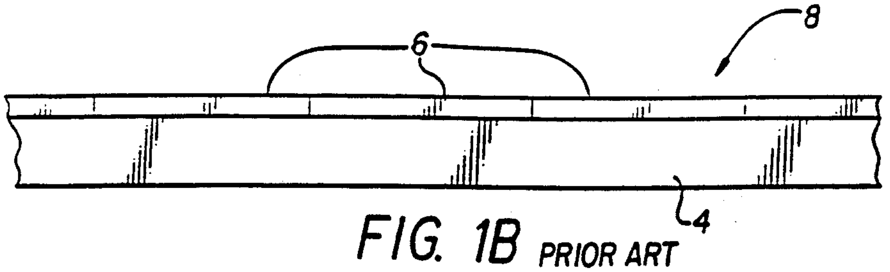
FIG. 1B PRIOR ART
FIG. 1B is a front view of a RIS or ROS array bar whereby a plurality of subunits are arranged on one side of a substrate and butted against one another thereon.
Figure 2A:
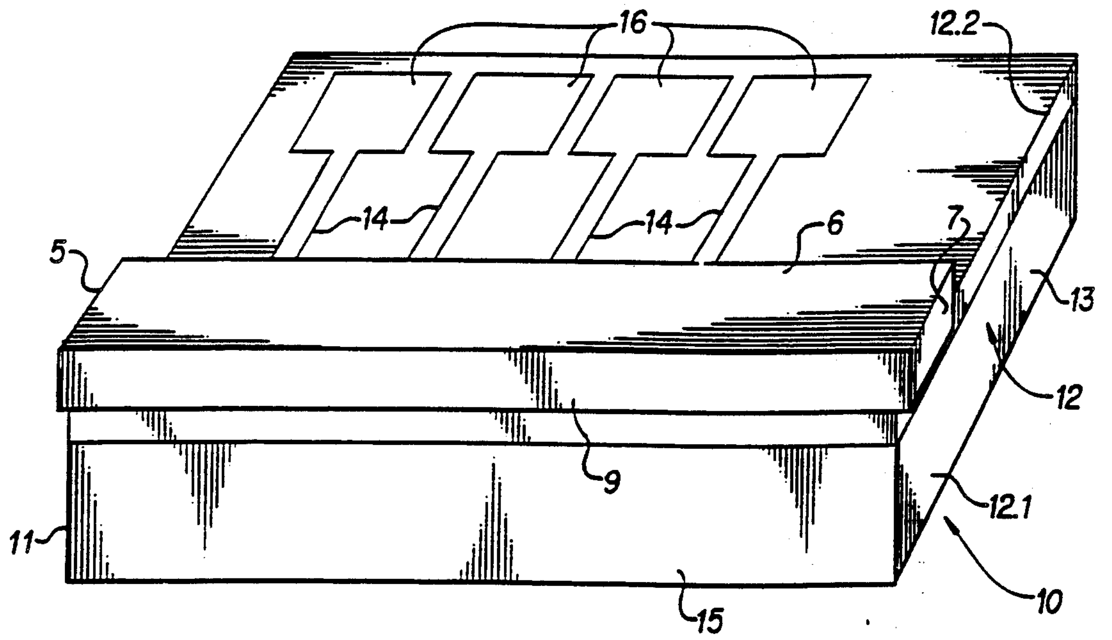
FIG. 2A is an enlarged isometric view of a RIS or ROS subunit according to the present invention wherein front and side edges of a semiconductive substrate extend outwardly beyond the front and side edges, respectively, of a support which is a daughterboard/heat sink.

FIG. 2A shows a subunit 10 usable in the fabrication of a RIS or ROS array bar according to the present invention. A semiconductive substrate 6, which can be for example, a thermal ink jet printhead or a Charge Coupled Device (to be described in more detail below), is mounted on and attached to the upper surface of a support 12. In the preferred embodiment, described below, support 12 can be, for example, a daughterboard/heat sink assembly and includes one or more electrodes 14 on its upper surface, each electrode 14 having a terminal 16 at one end thereof.

Figure 2B:
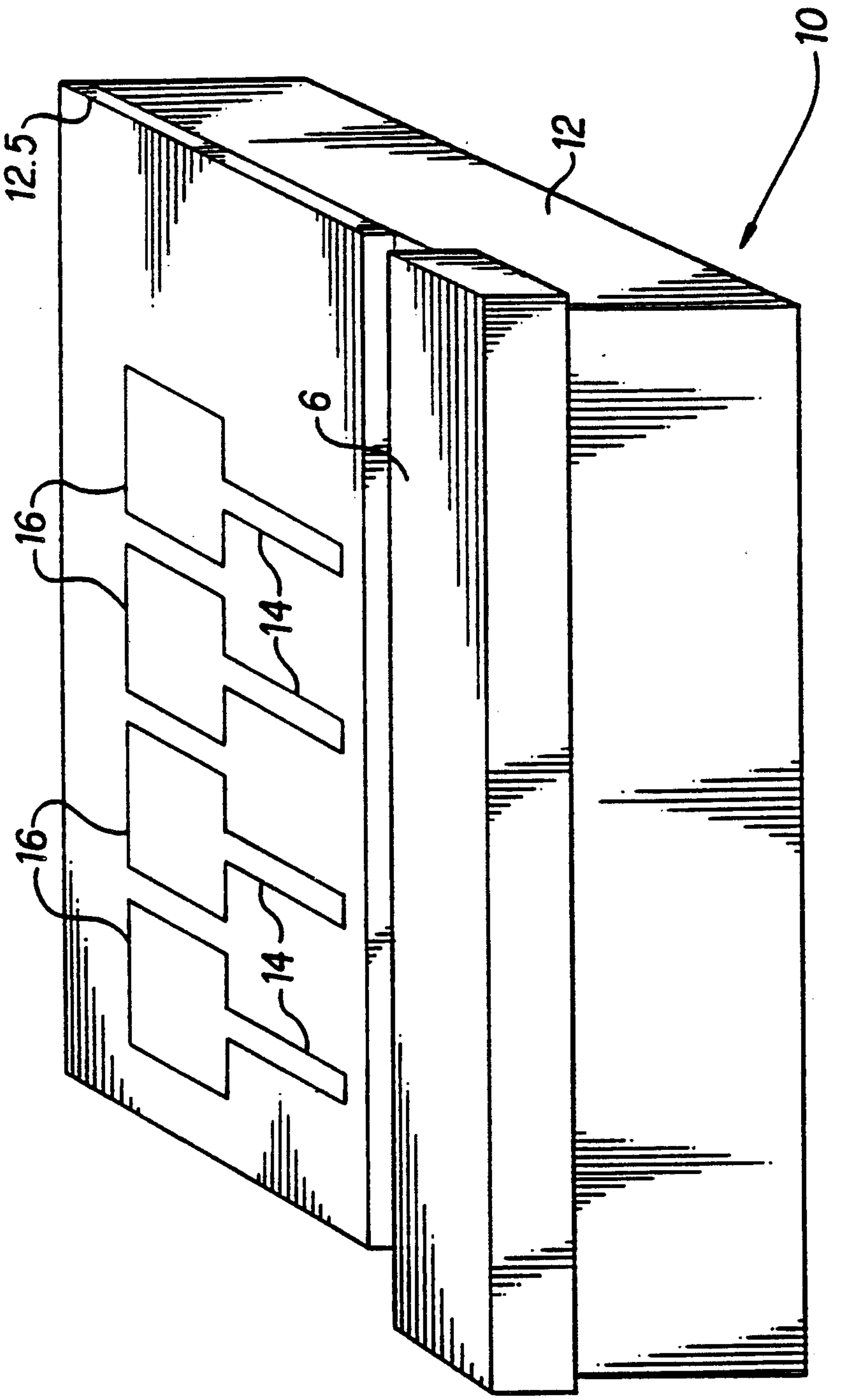
FIG. 2B is an enlarged isometric view similar to FIG. 2A, except the semiconductive substrate is mounted directly on a heat sink, with the daughterboard located on the heat sink behind the semiconductive substrate.

One type of daughterboard/heat sink assembly comprises an Insulated Metal Substrate (IMS) wherein a metal substrate which acts as a heat sink is coated with a ceramic, electrically insulative material on which electrodes 14 having terminals 16 are formed. IMS's can not be used in conditions where large amounts of heat are generated because the ceramic material and the metal usually have different expansion rates. One preferred daughterboard/heat sink assembly comprises a heat sink 12.1 having a daughterboard 12.2 mounted thereon by, for example, an adhesive. Heat sink 12.1 can be made from any material conventionally used for heat sinks such as, for example a metal or graphite. Good qualities for a heat sink material are that it be thermally conductive and also have a low thermal expansion coefficient. The daughterboard 12.2 can be constructed from any material conventionally used for daughterboards as long as electrodes 14, attachable at one end to circuitry on semiconductive substrate 6 and having terminals 16 at another end, are provided on a surface thereof. Preferably, terminals 16 are easily engageable with a connector, for example, a clip, so that the entire subunit (substrate 6, daughterboard 12.2 and heat sink 12.1) can be removed from the extended array. Regardless of the function of support 12, an important feature of support 12 is that it be planar so that when a semiconductive substrate 5 is mounted thereon, it will be precisely aligned with other semiconductive substrates mounted on other supports 12 in the array. Thus, in the example illustrated in FIG. 2A, both heat sink 12.1 and daughterboard 12.2 should be planar. However, if an arrangement is used, as shown in FIG. 2B, wherein a daughterboard 12.5 is only located over a rear portion of heat sink 12.1 so that semiconductive substrate 6 rests only on heat sink 12.1, only heat sink 12.1 needs to be made planar. Another important feature of support 12 is that it have a width B which is less than the width A of semiconductive substrate 6 for reasons to be discussed below.

Circuitry contained on semiconductive substrate 6 is electrically connected to the daughterboard electrodes 14 so that current pulses supplied to daughterboard terminals 16 will be applied to the components included on semiconductive substrate 6. Semiconductive substrate 6 has first and second side edges 5 and 7, a front edge 9 and a width A (see FIG. 5) which is equal to the distance between side edges 5 and 7. Daughterboard/heat sink 12 includes first and second side edges 11 and 13, front edge 15 and a width B which is equal to the distance between first and second side edges 11 and 13. As illustrated in FIG. 5, the width A of the semiconductive substrate 6 is greater than the width B of daughterboard/heat sink 12 so that first and second side edges 5, 7 of semiconductive substrate 6 extend outwardly beyond first and second side edges 11, 13 of daughterboard/heat sink 12. Making support or daughterboard/heat sink 12 with a width which is less than the width of semiconductive substrate 6 permits a large array bar to be fabricated using the same-side approach while allowing for easy replacement of individual subunits. Thus, the construction of the present invention permits all of the advantages of the same-side approach to be realized without suffering from the primary disadvantage of that approach: difficulty in replacing defective or damaged subunits. When a subunit requires replacement, it is easily removed by detaching the electrical clip-type connector (not shown) from daughterboard terminals 16 and detaching the defective or damaged subunit from the array. Subunit 10 can be detached from the large array substrate bar by, for example, applying local heating to the subunit to free the subunit from the large array substrate bar as disclosed in the above-referenced U.S. Pat. No. 4,830,985 to Araghi et al. The defective or damaged subunit can then be extracted from the large array substrate bar by lifting or sliding therefrom.

Figure 3:
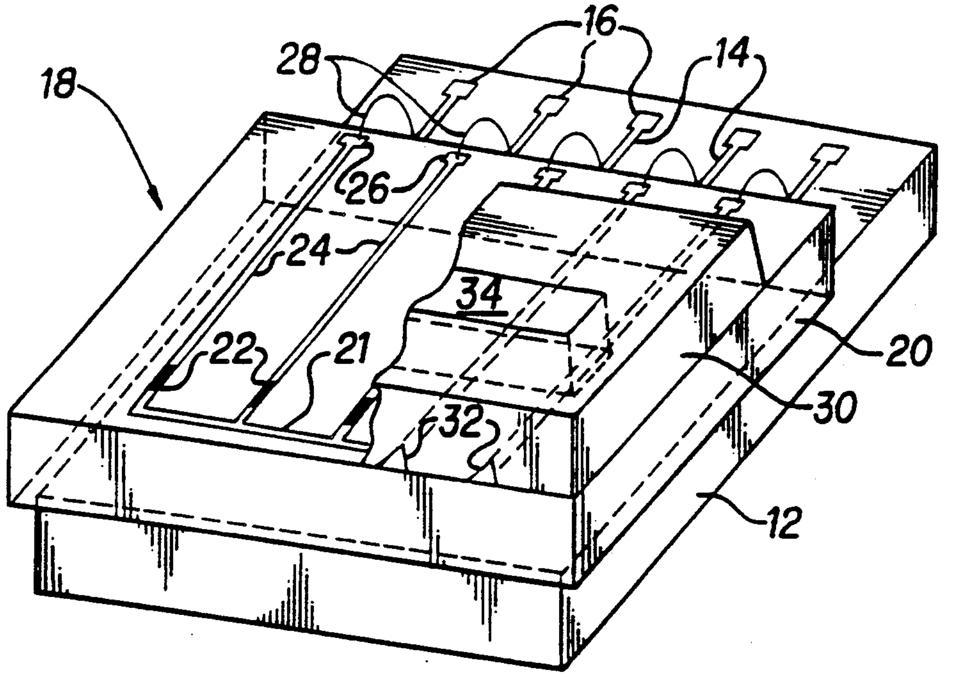
FIG. 3 is an enlarged isometric view of a thermal ink jet printhead having its channel plate partially removed and mounted on a support which is a daughterboard/heat sink according to the present invention.

FIG. 3 illustrates a thermal ink jet printhead 18 mounted and attached to daughterboard/heat sink 12. Thermal ink jet printhead 18 includes a semiconductive substrate 20 (also referred to as a heater plate) having a plurality of resistive heater elements 22 formed on an upper surface thereof. Each resistive heater element 22 can have its own addressing electrode 24 which includes a heater plate terminal 26 at one end thereof. Each of the resistive elements 22 is attached to a common return 21 that includes its own addressing electrode 24 and terminal 26. Heater plate terminals 26 are electrically connected to corresponding daughterboard electrodes 14 with wires 28 by using conventional wire-bonding techniques. A channel plate 30, which is typically made from silicon, includes a plurality of parallel ink channels on a lower surface thereof which terminate in nozzles 32 at one end and are attached to an ink supplying manifold 34 at another end so that ink can be supplied to nozzles 32 via manifold 34. Thermal ink jet printhead 18 can be fabricated using the techniques of the above-referenced U.S. Pat. No. 4,851,371, the disclosure of which is herein incorporated by reference. Other conventional techniques can be used to fabricate printhead 18 including techniques whereby circuitry including transistors and logic switches are formed on heater plate 20 so that each heating element 22 does not require its own addressing electrode 26.

Figure 4:
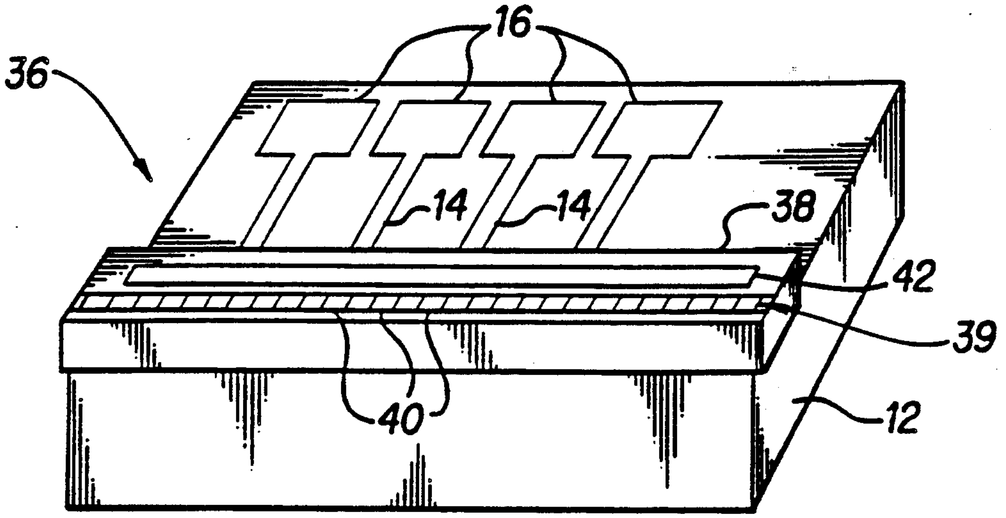
FIG. 4 is an enlarged isometric view of a RIS subunit having a plurality of photosites located on one surface of a planar semiconductive substrate and mounted on a daughterboard/heat sink according to the present invention.

FIG. 4 illustrates a small input scanning array 36 which may, for example, comprise Charge Coupled Device (CCD) or NMOS type arrays mounted on daughterboard/heat sink 12. Scanning array 36 is typically used to read or scan a document original line by line and convert the document image to electrical signals or pixels. Scanning array 36 includes a semiconductive substrate 38 having a row 39 of photosites 40 extending from one end to the other. Semiconductive substrate 38 also includes cooperating control circuitry 42, which may include logic gates and a shift register (not shown) for controlling operation of sensors 40. Sensors 40 may, for example, comprise photodiodes adapted to convert image rays impinging thereupon to electrical signals or pixels in the case of a read array. Image sensor subunit 36 can be fabricated any number of ways, which are well known in the art.

Figure 5A:
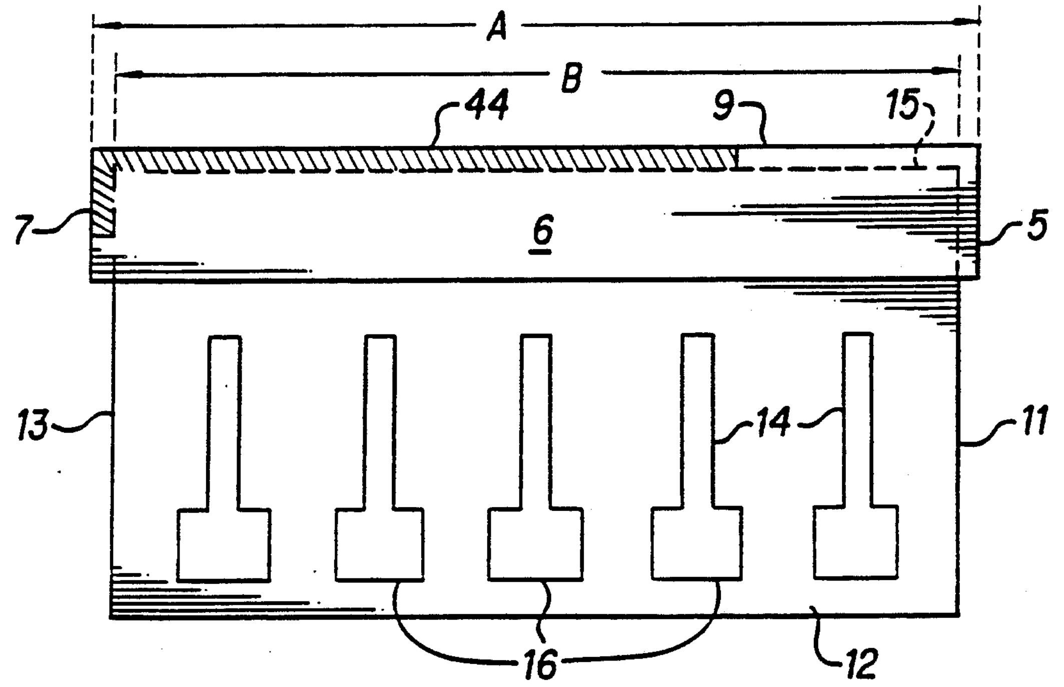
FIG. 5A is an enlarged plan view of a RIS or ROS subunit according to the present invention and illustrates the alignment tabs formed on a lower surface of the semiconductive substrate which are used to align the semiconductive substrate with the daughterboard/heat sink.

FIG. 5A illustrates alignment structure which can be formed on a lower surface of semiconductive substrate 6 for precisely aligning each semiconductive substrate 6 to its corresponding support or daughterboard/heat sink 12. In the embodiment illustrated in FIG. 5A, an L-shaped alignment tab 44 extends outwardly from a second or lower surface of semiconductive substrate 6 adjacent second side edge 7 and front edge 9. L-shaped tab 44 is butted against second side edge 13 and front edge 15 of daughterboard/heat sink 12 thereby precisely aligning semiconductive substrate 6 with daughterboard/heat sink 12. By precisely controlling the width A of semiconductive substrate 6 and the width B of daughterboard/heat sink 12, as well as the location of L-shaped tabs on the second or lower surface of semiconductive substrate 6 and the delineation of second side edge 13 and front edge 15 of daughterboard/heat sink 12, semiconductive substrate 6 can be precisely and accurately positioned on daughterboard/heat sink 12 with its first and second side edges 5, 7 and front edge 9 extending beyond the corresponding first and second side edges 11, 13 and front edge 15 of daughterboard 12. Semiconductive substrate 6 can be fabricated to have front and side edges which are precisely located relative to the component and circuitry thereon by using Orientation Dependent Etching (ODE) techniques, Reactive Ion Etching (RIE) or a precision dicing saw as disclosed in U.S. Pat. Nos. 4,830,985 and 4,851,371, as well as U.S. patent application Ser. No. 07/440,296, U.S. Pat. No. 4,961,821, filed Nov. 22, 1989 to Drake et al and assigned to the same assignee as the present application. A precision dicing saw or any other appropriate means can be used to precisely define the side and/or front edges of support 12 when necessary.

Figure 5B:
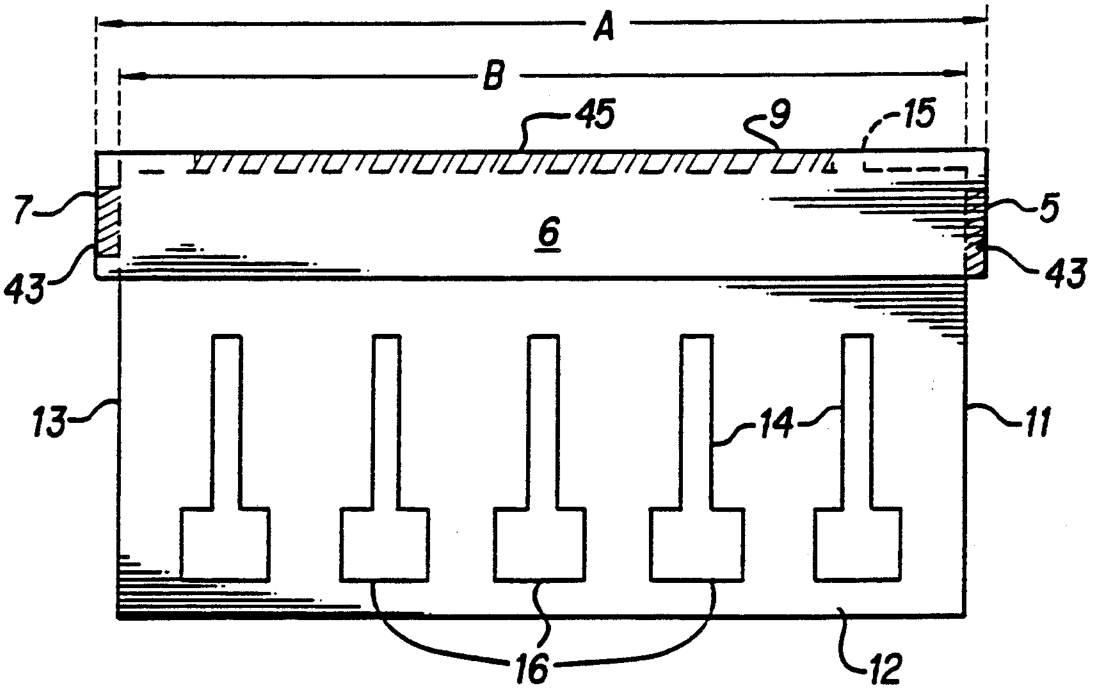
FIG. 5B is an enlarged plan view similar to FIG. 5A, illustrating alternative arrangements of alignment tabs.

L-shaped alignment tab 44 can be precisely located on the second or lower surface of semiconductive substrate 6 by the use of conventional photolithographic techniques wherein a photosensitive thick film material is patterned onto the bottom surface of semiconductive substrate 6. Although an L-shaped alignment tab 44 is shown in FIG. 5A, it is understood that various other arrangements of tabs can be formed on the lower surface of semiconductive substrate 6. For example, as shown in FIG. 5B, a single tab 43 can be formed adjacent second side edge 5 or a tab 43 can be formed adjacent both first side edge 5 and second side edge 7 without any tab adjacent front edge 9 if the only concern is the relative locations of the side edges of semiconductive substrate 6 relative to daughterboard/heat sink 12. Alternatively, a single tab 45 can be formed adjacent front edge 9 if the amount of overlap of the respective front edges of semiconductive substrate 6 and daughterboard/heat sink 12 is the only concern. In fact, no alignment tabs are required if the front and side edges of the semiconductive substrate 6 are the only feature to be used in aligning each subunit on an alignment substrate. In such a situation (to be described below) semiconductive substrate 6 need only be placed on daughterboard/heat sink 12 so that it overlaps daughterboard/heat sink 12 on the front and both sides by some small amount. In the above-mentioned situation, the only critical feature of support 12 is that it be less wide than substrate 6. However, when the side and/or front edges of support 12 are used for aligning each subunit 10 on a large array substrate bar, to be described below, these edges must be precisely defined.

Another way of precisely aligning a semiconductive substrate 6 to a support 12 utilizes an aligning jig (not shown). For example, an aligning jig can be provided having first and second alignment substrates which are precisely movable relative to each other by, for example, being hingedly attached to each other. One or more semiconductive substrates 6 are "flipped" over and placed on the first alignment substrate with their circuit containing surfaces facing down. Each of the "flipped" semiconductive substrates 6 is butted against alignment structure on the first alignment substrate and tightly secured thereto using a vacuum applied through apertures in the first alignment substrate to precisely locate each semiconductive substrate on the first alignment substrate. A similar procedure is performed to precisely locate a corresponding number of supports 12 on the second alignment substrate and then an adhesive is applied to the exposed surfaces of one of the semiconductive substrates 6 or supports 12. One of the first and second alignment substrates (e.g., the second alignment substrate) is pivoted about the hinged attachment towards the other alignment substrate (e.g., the first alignment substrate) so that each semiconductive substrate 6 is precisely aligned with and bonded to a corresponding support 12. It is understood that other types of aligning jigs, for example, aligning jigs comprising only a single alignment substrate upon which each semiconductive substrate 6 and support 12 are stacked and aligned, can also be used.

Figure 6A:
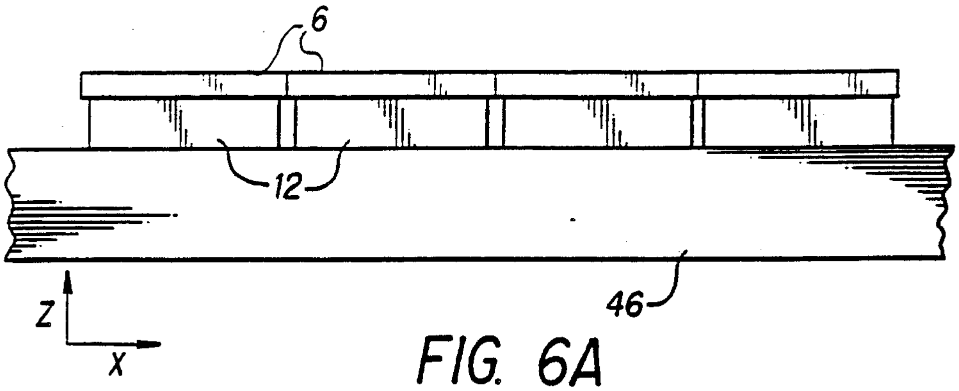
FIG. 6A is a front view of a RIS or ROS array bar fabricated by butting side edges of the semiconductive substrates from adjacent subunits against one another.
Figure 7:
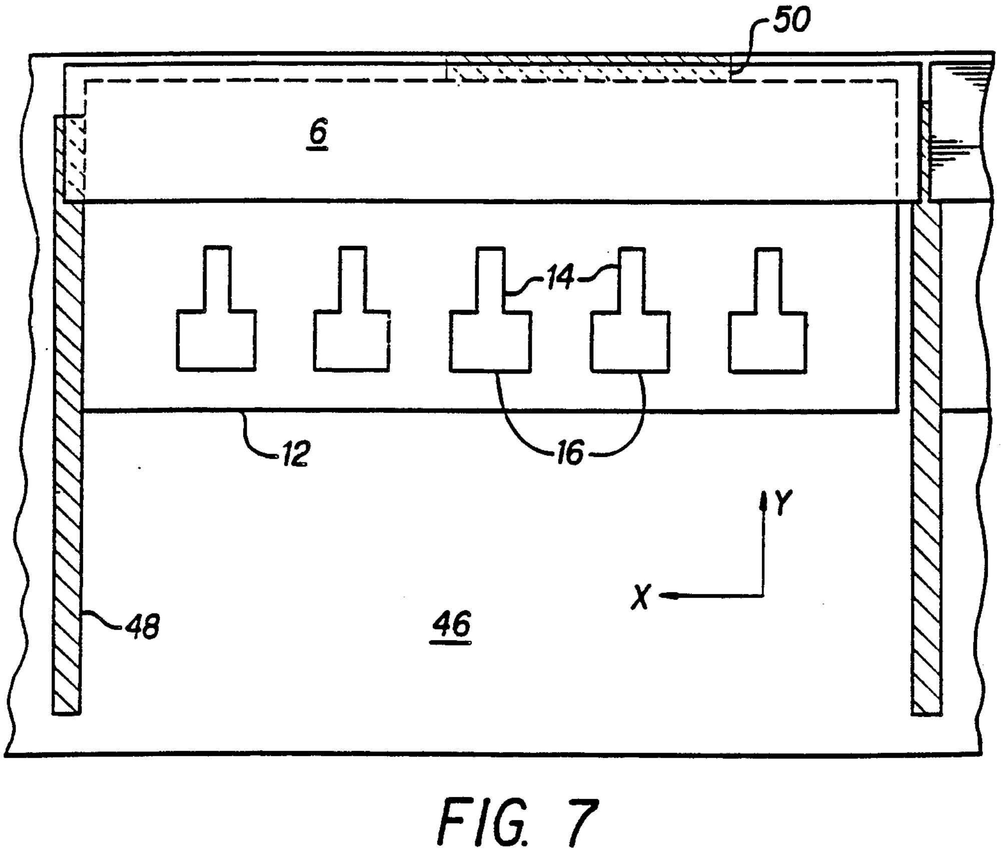
FIG. 7 is an enlarged plan view of a portion of the RIS or ROS array bar of FIG. 6B illustrating the location of the alignment features formed on the large array substrate bar relative to the side and front edges of a daughterboard/heat sink.

FIG. 6A illustrates an extended array of subunits which are formed by butting side edges 5, 7 of adjacent subunits to one another while being placed on a large array substrate bar 46. Since each semiconductive substrate 6 can be formed with precisely defined side and front edges, the abutment of the side edges of adjacent subunits to one another aligns each of the subunits in the X direction (illustrated by the X axis in FIG. 6A). The subunits are aligned with one another in the Y direction (the Y axis extends out of the page for FIG. 6A and is illustrated in FIG. 7), by butting the front edges 9 of each semiconductive substrate 6 against a planar alignment tool (not shown). After being aligned in the X and Y directions, the array of subunits is bonded to form an integral array by methods known in the art. For example a curable adhesive can be applied to the lower surfaces of daughterboard/heat sink assemblies 12 prior to placement on large array substrate bar 46. The curable adhesive is cured after each subunit is precisely aligned on substrate 46 so that the aligned array of subunits is bonded to substrate 46. Alternatively, a bonding substrate can be adhesively bonded to the aligned array along, for example, the array's front, rear, top or bottom sides to form the integral array. In this alternative embodiment, substrate 46 would not become part of the final product. It should be noted that by controlling the thickness of each semiconductive substrate 6 and daughterboard/heat sink 12, each subunit is also aligned in the Z direction. Additionally, by precisely locating the active components on the upper surface of each semiconductive substrate 6, the active components of each subunit are aligned in the $\theta$ direction as well.

Figure 6B:
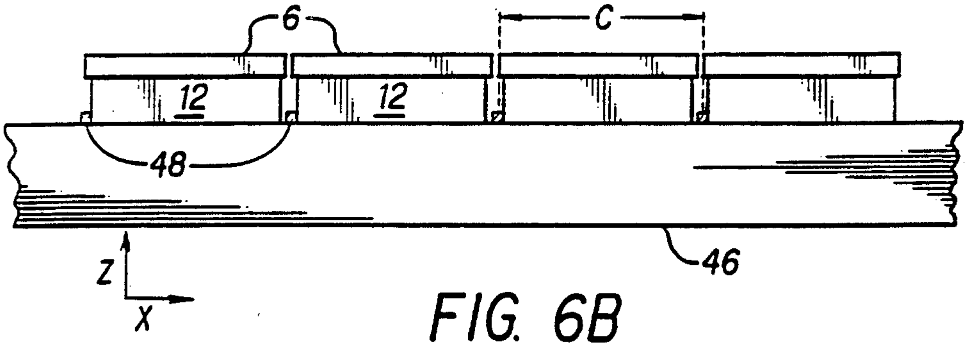
FIG. 6B is a front view of a RIS or ROS array bar fabricated by butting front and/or side edges of the supports from discrete subunits against an alignment feature formed on a surface of the large array substrate bar.

FIG. 6B illustrates a second method of fabricating extended RIS or ROS arrays using subunits of the present invention. In this second method, the side and/or front edges 11, 13, 15 of daughterboard/heat sink 12 are butted against an alignment structure formed on large array substrate bar 46. As shown in FIG. 7, a plurality of substantially parallel alignment rails 48 are formed on substrate 46. By butting second side edges 13 of each daughterboard/heat sink 12 against a corresponding alignment rail 48, each subunit is aligned in the X direction. A second aligning rail 50 extends substantially perpendicular to the first set of alignment rails 48 and functions to align the plurality of subunits in the Y direction by butting front edge 15 of daughterboard/heat sink 12 against second aligning rail 50. The second aligning rail can extend the entire width of substrate 46 or can include a plurality of segments 50, each segment corresponding to an aligning rail 48 of the first set of aligning rails. One advantage of this second method is that gaps can be provided between the semiconductive substrate 6 of adjacent subunits by spacing aligning rails 48 a distance C which is greater than the width A of each semiconductive substrate 6. The space compensates for thermal expansion mismatch between semiconductive substrate 6 and substrate 46 which can occur when the various components increase in temperature during use. Additionally, the space further ensures that adjacent subunits will not be damaged when a discrete subunit 10 is removed from the array. Furthermore, by using the daughterboard/heat sink edges for butting purposes, delicate circuitry located adjacent the front and in particular the side edges 5, 7 of semiconductive substrate 6 can be protected from damage which may occur when side edges 5, 7 are butted against adjacent semiconductive substrates 6 or an alignment tool. Since the side and front edges of support 12 are used for aligning subunits 10 on substrate 46, they must be precisely defined by , for example, a precision dicing saw.

While the present invention is described with reference to RIS and ROS bars, these particular embodiments are intended to be illustrative, not limiting. While support 12 is primarily described as a daughterboard/heat sink assembly, support need not perform any function other than acting as a mount for attaching semiconductive substrate 6 on a substrate. Additionally, support 12 could be only a heat sink or only a daughterboard, although a primary advantage of using a daughterboard/heat sink assembly is that the entire subunit can be electrically attached to its host machine with a connector which permits easy removal of the subunit from the extended array bar. Further, while substrate 6 has been referred to as a semiconductive substrate, other types of substrates having circuitry formed thereon can also be used. Various modifications may be made without departing from the spirit and scope of the invention as defined in the appended claims.

What is claimed:

1. A subunit comprising:

a planar semiconductive substrate having at least one component and supporting circuitry on a surface thereof, said planar semiconductive substrate having first and second side edges, a front edge and a width equal to a distance between said first and second side edges; and a planar support having first and second edges and a width equal to a distance between said first and second edges, said width being less than the width of said planar semiconductive substrate wherein said planar semiconductive substrate is mounted on and attached to said planar support so that said first and second side edges of said planar semiconductive substrate extend outwardly beyond said first and second side edges, respectively, of said support.

2. The subunit according to claim 1, wherein said support also has a front edge, the front edge of said semiconductive substrate extending outwardly beyond the front edge of said support.

3. The subunit according to claim 1, wherein said semiconductive substrate includes at least one alignment tab on a second surface thereof, said second surface being opposed from the surface which contains said at least one component and supporting circuitry thereon, said alignment tab extending outwardly from said second surface adjacent at least one of said first and second edges and contacting a corresponding at least one of said first and second edges of said support.

4. The subunit according to claim 3, wherein an alignment tab is formed on said second surface of said semiconductive substrate adjacent both the first and second edges thereof, each of said tabs contacting a corresponding one of the first and second edges of said support.

5. The subunit according to claim 2, wherein said semiconductive substrate includes at least one alignment tab on a second surface thereof, said second surface being opposed from the surface which contains said at least one component and supporting circuitry thereon, said alignment tab extending outwardly from said second surface adjacent at least one of said first and second side edges and said front edge and contacting a corresponding at least one of said first and second side edges and front edge of said support.

6. The subunit according to claim 5, wherein an alignment tab is formed on said second surface of said semiconductive substrate adjacent both said first side edge and said front edge, each of said tabs contacting the first side edge and front edge, respectively, of said support.

7. The subunit according to claim 6, wherein a further alignment tab is formed on said second surface of said semiconductive substrate adjacent said second side edge, said further alignment tab contacting the second side edge of said support.

8. The subunit according to claim 1, wherein said at least one component is a linear array of photosites and thus the subunit is an image sensor subunit 9. The subunit according to claim 1, wherein said at least one component is an ink flow directing silicon channel plate having parallel ink channels in communication with a manifold on one end and open at another end, wherein the supporting circuitry for said at least one component is a set of heating elements and passivated addressing electrodes which are formed on said surface of said planar semiconductive substrate with said channel plate aligned and bonded thereto, so that each ink channel contains a heating element and thus said subunit is a fully functional thermal ink jet printhead subunit.

10. The subunit according to claim 1, wherein said planar support is a planar daughterboard having at least one electrode which includes a terminal at one end thereof, said supporting circuitry on said semiconductive substrate being electrically connected to a second end of said at least one electrode.

11. The subunit according to claim 10, wherein said daughterboard includes a heat sink attached to a surface thereof opposite from the surface containing said at least one electrode.

* * * * *